United States Patent
Stoll et al.

(10) Patent No.: US 12,402,452 B2
(45) Date of Patent: Aug. 26, 2025

(54) METHOD FOR PRODUCING OPTOELECTRONIC COMPONENTS WITH CONVERTERS AND MIRROR LAYER SEQUENCES AND AN OPTOELECTRONIC COMPONENT WITH A CONVERTER AND A MIRROR LAYER SEQUENCE

(71) Applicant: ams-OSRAM International GmbH, Regensburg (DE)

(72) Inventors: Sebastian Stoll, Coburg (DE); Moritz Laubscher, Göllheim (DE)

(73) Assignee: ams-OSRAM International GmbH, Regensburg (DE)

( * ) Notice: Subject to any disclaimer, the term of this patent is extended or adjusted under 35 U.S.C. 154(b) by 444 days.

(21) Appl. No.: 17/797,762

(22) PCT Filed: Jan. 26, 2021

(86) PCT No.: PCT/EP2021/051684
§ 371 (c)(1),
(2) Date: Aug. 5, 2022

(87) PCT Pub. No.: WO2021/156098
PCT Pub. Date: Aug. 12, 2021

(65) Prior Publication Data
US 2023/0064885 A1 Mar. 2, 2023

(30) Foreign Application Priority Data
Feb. 6, 2020 (DE) .................. 102020103070.3

(51) Int. Cl.
*H10H 20/851* (2025.01)
*C09K 11/02* (2006.01)
(Continued)

(52) U.S. Cl.
CPC ......... *H10H 20/8512* (2025.01); *C09K 11/02* (2013.01); *H01S 5/0201* (2013.01);
(Continued)

(58) Field of Classification Search
None
See application file for complete search history.

(56) References Cited

U.S. PATENT DOCUMENTS 8,900,888 B2 * 12/2014 Gmeinwieser ..... H10H 20/8516
438/16
9,500,938 B2 11/2016 Wiener et al.
(Continued)

FOREIGN PATENT DOCUMENTS

CN 1805158 A 7/2006
DE 102012109806 A1 4/2014
(Continued)

*Primary Examiner* — Nduka E Ojeh
(74) *Attorney, Agent, or Firm* — Slater Matsil, LLP

(57) ABSTRACT

In an embodiment a method includes providing a plurality of radiation-emitting semiconductor chips configured to emit primary radiation of a first wavelength range, applying a converter on the plurality of radiation-emitting semiconductor chips, the converter configured to emit secondary radiation of a second wavelength range, applying a mirror layer sequence arranged downstream of the converter, the mirror layer sequence configured to reflect the primary radiation and transmit the secondary radiation and singulating the plurality of radiation-emitting semiconductor chips in order to produce optoelectronic components, wherein the converter is applied on the plurality of radiation-emitting semiconductor chips by spray coating, and wherein the mirror layer sequence is applied on the converter by sputtering, atomic layer deposition and/or plasma-enhanced chemical vapor deposition (PECVD).

16 Claims, 4 Drawing Sheets

(51) Int. Cl.
*H01S 5/02* (2006.01)
*H10H 20/01* (2025.01)
*H10H 20/856* (2025.01)

(52) U.S. Cl.
CPC .......... *H10H 20/01* (2025.01); *H10H 20/856* (2025.01); *H10H 20/0361* (2025.01); *H10H 20/0363* (2025.01)

(56) References Cited

U.S. PATENT DOCUMENTS

| | | | |
|---|---|---|---|
| 2015/0268543 A1* | 9/2015 | Wiener ................ | G03B 21/204 |
| | | | 353/31 |
| 2017/0062680 A1* | 3/2017 | Yoo ..................... | H10H 20/825 |
| 2018/0254386 A1* | 9/2018 | Perzlmaier ............... | A23B 2/40 |
| 2018/0261732 A1* | 9/2018 | Richter ............. | H10H 20/8506 |
| 2018/0309030 A1* | 10/2018 | Herrmann ................ | A23B 2/40 |
| 2018/0358514 A1* | 12/2018 | Tragl ................ | H10H 20/8512 |

FOREIGN PATENT DOCUMENTS

| | | |
|---|---|---|
| DE | 102017130136 A1 | 6/2019 |
| EP | 3410497 A1 | 12/2018 |
| WO | 2010064177 A1 | 6/2010 |
| WO | 2013038579 A1 | 3/2013 |

* cited by examiner

METHOD FOR PRODUCING OPTOELECTRONIC COMPONENTS WITH CONVERTERS AND MIRROR LAYER SEQUENCES AND AN OPTOELECTRONIC COMPONENT WITH A CONVERTER AND A MIRROR LAYER SEQUENCE

This patent application is a national phase filing under section 371 of PCT/EP2021051684, filed Jan. 26, 2021, which claims the priority of German patent application 102020103070.3, filed Feb. 6, 2020, each of which is incorporated herein by reference in its entirety.

TECHNICAL FIELD

A method for producing optoelectronic components is provided. An optoelectronic component is furthermore provided.

SUMMARY

Embodiments provide a method for producing optoelectronic components having improved properties. Further embodiments provide an optoelectronic component having improved properties.

Optoelectronic components may comprise at least one semiconductor chip which emits electromagnetic radiation in a particular wavelength range. For example, the optoelectronic component is a semiconductor laser component or a light-emitting diode.

According to one embodiment of the method for producing optoelectronic components, a multiplicity of radiation-emitting semiconductor chips, which are designed to emit primary radiation of a first wavelength range during operation, are provided.

Preferably, each of the multiplicity of radiation-emitting semiconductor chips emits the primary radiation of the first wavelength range from a radiation exit face. In particular, the multiplicity of radiation-emitting semiconductor chips emit primary radiation from the ultraviolet spectral range and/or from the visible spectral range, particularly preferably from the blue spectral range, during operation.

The multiplicity of radiation-emitting semiconductor chips are, for example, a multiplicity of light-emitting diode chips or a multiplicity of laser diode chips. Preferably, the multiplicity of radiation-emitting semiconductor chips comprise an epitaxially grown semiconductor layer sequence having an active zone, which is designed to generate primary radiation. For this purpose, the active zone comprises for example a pn junction, a double heterostructure, a single quantum well structure or particularly preferably a multiple quantum well structure.

For example, the semiconductor chips are arranged at a particular predeterminable distance from one another on an auxiliary carrier.

According to at least one embodiment of the method, a converter, which is designed for emitting secondary radiation of a second wavelength range, is applied onto the multiplicity of radiation-emitting semiconductor chips. The converter comprises, for example, phosphors and a matrix. The matrix is preferably configured to be transmissive or clearly transparent for electromagnetic radiation, for example visible light. The converter preferably converts the primary radiation of the multiplicity of radiation-emitting semiconductor chips into secondary radiation. The converter is preferably applied as a continuous layer onto the multiplicity of radiation-emitting semiconductor chips.

The phosphors are introduced into the matrix in the form of phosphor particles. The matrix in this case encapsulates the phosphor particles preferably fully, that is to say the phosphor particles are preferably embedded in the matrix. The phosphor particles convert the primary radiation of the first wavelength range into secondary radiation of the second wavelength range during operation. The primary radiation is preferably different to the secondary radiation. The phosphor particles which are embedded in the matrix preferably impart wavelength-converting properties to a conversion element. For example, the conversion element having the phosphor particles converts the primary radiation of the semiconductor chip only partially into secondary radiation, while a further part of the primary radiation of the semiconductor chip is transmitted by the conversion element.

The phosphor is, for example, a ceramic phosphor and/or a quantum dot phosphor. Preferably, the ceramic phosphors comprise a garnet phosphor. Particularly preferably, the garnet phosphor is a YAG phosphor with the chemical formula $Y_3Al_5O_{12}:Ce_3^+$ or a LuAG phosphor with the chemical formula $Lu_3Al_5O_{12}:Ce_3^+$. Furthermore, the ceramic phosphors may also comprise a nitride phosphor. The nitride phosphors preferably convert blue primary radiation into red secondary radiation. The nitride phosphor may for example be an alkaline earth silicon nitride, an oxynitride, an aluminum oxynitride, a silicon nitride or a SiAlON. For example, the nitride phosphor is $(Ca,Sr,Ba)AlSiN_3:Eu^{2+}$ (CASN), $Sr(Ca,Sr)Al_2Si_2N_6:Eu^{2+}$ (SCASN) or $M_2Si_5N_8:Eu^{2+}$ with M=Ca, Ba or Sr alone or in combination.

Further possible materials for the phosphors are, in particular, the following aluminum-containing and/or silicon-containing phosphor particles:

$(Ba_{1-x-y}Sr_xCa_y)SiO_4:Eu^{2+}$ ($0 \leq x \leq 1$, $0 \leq y \leq 1$), $(Ba_{1-x-y}Sr_xCa_y)_3SiO_5:Eu^{2+}$ ($0 \leq x \leq 1$, $0 \leq y \leq 1$), $Li_2SrSiO_4:Eu^{2+}$, $CasMg(SiO_4)_4Cl_2:Eu^{2+}$, oxonitrides such as $(Ba_{1-x-y}Sr_xCa_y)Si_2O_2N_2:Eu^{2+}$ ($0 \leq x \leq 1$; $0 \leq y \leq 1$), $SrSiAl_2O_3N_2:Eu^{2+}$, $Ba_{4-x}Ca_xSi_6ON_{10}:Eu^{2+}$ ($0 \leq x \leq 1$), $(Ba_{1-x}Sr_x)Y_2Si_2Al_2O_2N_5:Eu^{2+}$ ($0 \leq x \leq 1$), $Sr_xSi_{(6-y)}Al_{y-}O_yN_{(8-y)}:Eu^{2+}$ ($0.05 \leq x \leq 0.5$; $0.001 \leq y \leq 0.5$), $Ba_3Si_6O_{12}N_2:Eu^{2+}$, $Si_6-2Al_2O_2N_8-z:Eu^{2+}$ ($0 \leq z \leq 0.42$), $M_xSi_{12-m-n}Al_{m+n}OnN_{16-n}:Eu^{2+}$ (M=Li, Mg, Ca, Y; x=m/v; v=valency of M, x≤2), $M_xSi_{12-m-n}Al_{m+n}OnN_{16-n}:Ce_3^+$, $AE_{2-x-a}RE_xEu_aSi_{1-y}O_{4-x-2y}N_x$ (AE=Sr, Ba, Ca, Mg; RE=rare earth metal elements), $AE_{2-x-a}RE_xEu_aSi_{1-y}O_{4-x-2y}N_x$ (AE=Sr, Ba, Ca, Mg; RE=rare earth metal elements), $Ba_3Si_6O_{12}N_2:Eu^{2+}$ or nitrides such as $La_3Si_6N_{11}:Ce_3^+$, $(Ba_{1-x-y}Sr_xCa_y)_2Si_5N_8:Eu^{2+}$, $(Ca_{1-x-y}Sr_xBay)AlSiN_3:Eu^{2+}$ ($0 \leq x \leq 1$; $0 \leq y \leq 1$), $Sr(Sr_{1-x}Ca_x)Al_2Si_2N_6:Eu^{2+}$ ($0 \leq x \leq 0.2$), $Sr(Sr_{1-x}Ca_x)Al_2Si_2N_6:Ce_3^+$ ($0 \leq x \leq 0.2$) $SrAlSi_4N_7:Eu^{2+}$, $(Ba_{1-x-y}Sr_xCa_y)SiN_2:Eu^{2+}$ ($0 \leq x \leq 1$; $0 \leq y \leq 1$), $(Ba_{1-x-y}Sr_xCa_y)SiN_2:Ce_3^+$ ($0 \leq x \leq 1$; $0 \leq y \leq 1$), $(Sr_{1-x}Ca_x)LiAl_3N_4:Eu^{2+}$ ($0 \leq x \leq 1$), $(Ba_{1-x-y}Sr_xCa_y)Mg_2Al_2N_4:Eu^{2+}$ ($0 \leq x \leq 1$; $0 \leq y \leq 1$), $(Ba_{1-x-y}Sr_xCa_y)Mg_3SiN_4:Eu^{2+}$ ($0 \leq x \leq 1$; $0 \leq y \leq 1$).

For example, the combination of a plurality of different phosphor particles is possible.

According to at least one embodiment, a mirror layer sequence, which is designed to reflect the primary radiation and transmit the secondary radiation, is applied, the mirror layer sequence being arranged downstream of the converter. The mirror layer sequence is, in particular, applied over the whole surface onto the converter. For example, the mirror layer sequence is applied as a continuous layer onto the converter.

The mirror layer sequence is, in particular, designed to reflect the primary radiation of the semiconductor chips for the most part and to transmit the secondary radiation of the converter for the most part. That is to say, at least 50% of the primary radiation is reflected and at least 50% of the secondary radiation of the converter is transmitted. In particular, at least 80% of the primary radiation is reflected by the mirror layer sequence and at least 80% of the secondary radiation is transmitted. The effect of this is that the primary radiation is reflected until it is converted by the converter into secondary radiation and can therefore no longer be reflected by the mirror layer sequence and is emitted as secondary radiation. The efficiency of the light output of the secondary radiation may therefore be improved.

The mirror layer sequence is, for example, a DBR layer sequence (distributed Bragg reflector). The mirror layer sequence comprises, for example, a periodic layer stack consisting of alternating first layers of a first dielectric material having a first refractive index $n_1$ and second layers of a second dielectric material having a second refractive index $n_2$. The first refractive index $n_1$ and the second refractive index $n_2$ advantageously have a difference which is as large as possible in order to achieve a maximally high reflection. Further alternating layers having further refractive indices are possible.

The layer thicknesses of the first layers and second layers of the layer pairs are adjusted in a layer sequence so that the optical layer thickness $n*d$ is equal to one fourth of the wavelength $\lambda/4$ of the primary wavelength $\lambda$, at which the mirror layer sequence is intended to have its reflection maximum. Here and in what follows, the optical layer thickness is understood as the product of the thickness d and the refractive index n. For example, a material of the mirror layer sequence is silicon dioxide. The refractive index $n_1$ is in this case about 1.5. A further material is preferably a titanium oxide, an aluminum oxide or a niobium oxide, in particular $TiO_2$, $Al_2O_3$ or $Nb_2O_5$. Titanium oxide advantageously has a relatively high refractive index, which is about $n_2=2.5$. Because of the relatively high refractive index difference between silicon dioxide and titanium oxide, this material pairing is suitable in particular for achieving a high reflection in the wavelength range of the primary radiation. The mirror layer sequence is distinguished in particular by a high reflectivity in a spectrally very small wavelength range, for example of the primary radiation.

According to at least one embodiment, the multiplicity of radiation-emitting semiconductor chips are singulated in order to produce optoelectronic components. This also means, in particular, singulation of the converter and the mirror layer sequence. The singulation is carried out for example by sawing, etching, grooving, undercut etching, scoring, fracturing or by laser dicing. During the singulation, care is taken that the radiation-emitting semiconductor chips are not damaged, so that each radiation-emitting semiconductor chip with a part of the converter and a part of the mirror layer sequence forms an optoelectronic component.

According to at least one embodiment of the method for producing optoelectronic components, a multiplicity of radiation-emitting semiconductor chips, which are designed to emit primary radiation of a first wavelength range during operation, are provided. A converter, which is designed for emitting secondary radiation of a second wavelength range, is subsequently applied onto the multiplicity of radiation-emitting semiconductor chips. A mirror layer sequence, which is designed to reflect the primary radiation and transmit the secondary radiation, is applied, the mirror layer sequence being arranged downstream of the converter, and the multiplicity of radiation-emitting semiconductor chips are singulated in order to produce optoelectronic components.

According to at least one embodiment, the method for producing optoelectronic components is carried out in the order indicated.

One concept of the method for producing optoelectronic components is to apply a converter and a mirror layer sequence onto a multiplicity of radiation-emitting semiconductor chips, so as to provide an economical and simplified method for producing optoelectronic components.

According to at least one embodiment, the provision of the multiplicity of radiation-emitting semiconductor chips is carried out in a wafer assembly. The wafer is, for example, a 6" wafer fully occupied with radiation-emitting semiconductor chips with a size of 1 $mm^2$. The provision of the multiplicity of radiation-emitting semiconductor chips in the wafer assembly leads to cost advantages and an improvement in the process speed.

According to at least one embodiment, the converter is applied onto the multiplicity of radiation-emitting semiconductor chips by means of spray coating. This presupposes that the converter is in an uncured state at the instant of application onto the multiplicity of radiation-emitting semiconductor chips. The converter comprises, for example, a matrix and a multiplicity of phosphor particles or consists of a layer of phosphor particles. The matrix is for example a silicone, an epoxide or a hybrid material. The phosphor particles are, for example, ceramic phosphor particles and/or quantum dots. The spray coating is carried out in from one to three sprayed layers. For example, the converter having the phosphor YAG is applied onto the multiplicity of radiation-emitting semiconductor chips by means of a sprayed layer. By the low number of sprayed layers, the production speed is increased and the production costs are minimized.

According to at least one embodiment, the mirror layer sequence is applied onto the converter by means of sputtering, atomic layer deposition and/or plasma-enhanced chemical vapor deposition. The mirror layer sequence may be applied onto the converter at room temperature. The converter is in particular in a cured state. If the converter is present in a cured state, an adhesive layer is likewise not necessary since the bonding forces between the matrix of the converter and the mirror layer sequence are sufficient.

According to at least one embodiment, the mirror layer sequence is applied directly onto the converter. This means that there is no further layer between the converter and the mirror layer sequence. The matrix of the converter is, for example, present in an uncured state during the application of the mirror layer sequence. The mirror layer sequence therefore bonds to the matrix. This is carried out by the uncured matrix having adhesive properties, so that the mirror layer sequence can preferably bond to the matrix.

According to at least one embodiment, the mirror layer sequence is applied onto a carrier and the carrier is arranged downstream of the converter, so that the mirror layer sequence is arranged between the converter and the carrier. The carrier is preferably transparent for electromagnetic radiation. Furthermore, the carrier preferably comprises glass as a material. The mirror layer sequence is, in particular, vapor deposited onto the carrier and a thickness of the carrier is subsequently thinned to less than 200 micrometers. The mirror layer sequence is arranged on the converter so that the mirror layer sequence is arranged between the converter and the carrier. In particular, no adhesive layer is arranged between the carrier and the mirror layer sequence. Furthermore, in particular, no adhesive layer is arranged between the converter and the mirror layer sequence. The converter is initially in an uncured state. The bonding takes place by the curing. The efficiency and robustness are therefore improved.

According to at least one embodiment, the converter is cured after the application of the mirror layer sequence. Therefore, inter alia, a smooth converter surface which is in contact with the mirror layer sequence can be achieved. By the curing of the converter after the application of the mirror layer sequence, the adhesion of the mirror layer sequence on the converter is advantageously improved. Furthermore, extraneous particle adhesion on the surface of the component is reduced and improved encapsulation from the surroundings is achieved in comparison with tacky cured matrix surfaces. In addition, a lower gas permeability is achieved.

An optoelectronic component is furthermore provided. In particular, an optoelectronic component as described here may be produced by the method described here for producing optoelectronic components. That is to say all features which are disclosed for the method for producing optoelectronic components are also disclosed for the optoelectronic component, and vice versa.

According to at least one embodiment, the optoelectronic component comprises a radiation-emitting semiconductor chip, which emits primary radiation of a first wavelength range during operation. The radiation-emitting semiconductor chip comprises a radiation exit face.

The semiconductor chip is, for example, a light-emitting diode chip or a laser diode chip. Preferably, the semiconductor chip comprises an epitaxially grown semiconductor layer sequence having an active zone, which is designed to generate electromagnetic radiation. For this purpose, the active zone comprises for example a pn junction, a double heterostructure, a single quantum well structure or particularly preferably a multiple quantum well structure. Preferably, the semiconductor chip emits electromagnetic radiation from the ultraviolet spectral range and/or the visible spectral range, particularly preferably from the blue spectral range, during operation.

According to at least one embodiment, the optoelectronic component comprises a conversion element which is designed for emitting secondary radiation of a second wavelength range. The conversion element preferably converts the primary radiation of the radiation-emitting semiconductor chip into secondary radiation. The conversion element is obtained, for example, by singulation from the converter described in relation to the method. In particular, the conversion element is arranged on the radiation exit face of the radiation-emitting semiconductor chip.

According to at least one embodiment, the optoelectronic component comprises a dielectric mirror. The dielectric mirror is obtained, for example, by singulation from the mirror layer sequence described in relation to the method.

According to at least one embodiment, the dielectric mirror is designed to reflect the primary radiation and transmit the secondary radiation.

According to at least one embodiment, the dielectric mirror is arranged downstream of the semiconductor chip. The dielectric layer is preferably arranged on the conversion element.

According to at least one embodiment, the side faces of the dielectric mirror and of the conversion element comprise tracks of a singulation process. That is to say the conversion element, the semiconductor chip and the dielectric mirror are arranged above one another surface-wide. These tracks of the singulation process are formed for example by sawing, etching, scoring, fracturing or laser dicing. The tracks are, for example, grooves, roughenings or undercut etchings.

According to at least one embodiment, the optoelectronic component comprises a radiation-emitting semiconductor chip, which emits primary radiation of a first wavelength range during operation, a conversion element, which is designed for emitting secondary radiation of a second wavelength range, and a dielectric mirror, the dielectric mirror being designed to reflect the primary radiation and transmit the secondary radiation. The dielectric mirror is arranged downstream of the semiconductor chip, and the side faces of the dielectric mirror and of the conversion element comprise tracks of a singulation process.

According to at least one embodiment, the conversion element comprises a matrix material and a phosphor. The matrix material is obtained, for example, by singulation from the matrix described in relation to the method. The matrix material is present in a cured state and is selected from the group consisting of silicones, epoxides and hybrid materials.

According to at least one embodiment, the secondary radiation of the conversion element is red light. The phosphor which converts the primary radiation of the semiconductor chip into secondary radiation is, for example, a CASN phosphor. The CASN phosphor belongs to the group of nitride phosphors and has the following formula $(Ca,Sr,Ba)AlSiN_3:Eu^{2+}$. In comparison with red-emitting optoelectronic components without dielectric mirrors, the optoelectronic component described here has an increased efficiency and advantageously a lower number of sprayed layers.

According to at least one embodiment, the optoelectronic component emits predominantly secondary radiation during operation. In particular, the optoelectronic component emits only secondary radiation. That is to say, the optoelectronic component preferably almost entirely emits red light secondary radiation. Here, full conversion of red light is presented. Full conversion occurs beyond a color purity greater than or equal to 70%. Preferably, the full conversion of red light takes place beyond a color purity greater than or equal to 80%. Particularly preferably, the full conversion of red light takes place beyond a color purity greater than or equal to 92%. The color purity refers to a relative distance of a color locus in a CIE standard color system from a white point and a spectral color line or a purple line. A straight line which extends through the color locus starting from the white point has a point of intersection with the spectral color line or the purple line. There is a first distance between the white point and the color locus, while there is a second distance between the white point and the point of intersection with the spectral color line or the purple line. The color purity is given by a ratio of the first distance to the second distance. Advantageously, the efficiency and brightness of the optoelectronic component are improved by the full conversion.

According to at least one embodiment, at least 95% secondary radiation and at most 5% primary radiation is emitted by the optoelectronic component, expressed in terms of the integral of the emission peaks.

According to at least one embodiment, a color locus of the emitted radiation of the optoelectronic component lies in a color rectangle having corners at the coordinates (0.655, 0.337), (0.658, 0.337), (0.655, 0.339) and (0.658, 0.339) in the xy CIE standard color system. This corresponds to red light emission of the optoelectronic component.

According to at least one embodiment, the conversion element is arranged downstream of the semiconductor chip and is arranged between the semiconductor chip and the dielectric mirror. The conversion element is, in particular, in direct contact with the semiconductor chip and with the dielectric mirror. Furthermore, the conversion element is arranged surface-wide over the semiconductor chip. In particular, the conversion element and/or the dielectric mirror has a smooth surface on the side facing away from the semiconductor chip.

According to at least one embodiment, the conversion element is configured as a layer and has a thickness of between at least 50 micrometers and at most 100 micrometers. Preferably, the conversion element has a thickness of from at least 50 micrometers to at most 70 micrometers. The conversion element is configured to be particularly thin in comparison with an optoelectronic component without dielectric mirrors. This is due to the dielectric mirror, which reflects the primary radiation until it is converted by the conversion element into secondary radiation and is transmitted through the dielectric layer.

According to at least one embodiment, the dielectric mirror has a thickness of at most 10 micrometers. Preferably, the dielectric mirror has a thickness of at most 8 micrometers.

According to at least one embodiment, the dielectric mirror comprises a plurality of layers with respectively different refractive indices. The dielectric mirror comprises a periodic sequence of a plurality of layers with a varying refractive index. The dielectric mirror is furthermore distinguished, in particular, by a high reflectivity in a spectrally very small wavelength range, preferably in the wavelength range of the primary radiation.

According to at least one embodiment, a carrier element is arranged on the dielectric mirror. The carrier element is, for example, a glass carrier. The thickness of the carrier element is preferably at most 200 micrometers. Thicker carrier elements are likewise possible, but have disadvantages in efficiency. Advantageously, an adhesive layer is not necessary between the dielectric mirror and the carrier element. The carrier element is obtained, for example, by singulation from the carrier described in relation to the method.

One concept of the present optoelectronic component is to generate light of any selected color, since the limitation of a ceramic of the sintering process, particularly for red light, is obviated.

Furthermore, an adhesive layer is not necessary between the conversion element and the dielectric mirror. The use of an optoelectronic component without an adhesive layer between the conversion element and the dielectric mirror advantageously leads to an increased efficiency and robustness.

Moreover, the optoelectronic components may be processed at the wafer level, which leads to a cost advantage and to an advantage in the process speed.

In addition, the surface condition of the conversion element is improved by the application of the dielectric mirror with the carrier element, by this surface being smoothed and the extraneous particle adhesion on the surface of the carrier element being reduced.

In comparison with optoelectronic components without a dielectric layer, the optoelectronic component described here comprises a thinner conversion element because of a lower concentration of phosphors. This advantageously leads to a higher efficiency because of lower reabsorption and scattering as well as an improved thermal behavior. This in turn leads to an improved robustness and to an improved quenching behavior.

In addition, fewer sprayed layers are needed during the application of the converter. This is therefore more cost-efficient and the process speed is improved.

Furthermore, a more compact design can be made possible by the thinner conversion element.

A further advantage is that the full conversion has a brightness advantage at the same color locus in comparison with optoelectronic components without a dielectric layer.

BRIEF DESCRIPTION OF THE DRAWINGS

Further advantageous embodiments and refinements of the method for producing optoelectronic components and of the optoelectronic component may be found in the exemplary embodiments described below in connection with the figures, in which.

DETAILED DESCRIPTION OF ILLUSTRATIVE EMBODIMENTS

Elements which are the same or similar, or which have the same effect, are provided with the same references in the figures. The figures and the size proportions of the elements represented in the figures with respect to one another are not to be considered as being true to scale. Rather, individual elements, and in particular layer thicknesses, may be represented exaggeratedly large for improved representability and/or improved understanding.

Figure 1:
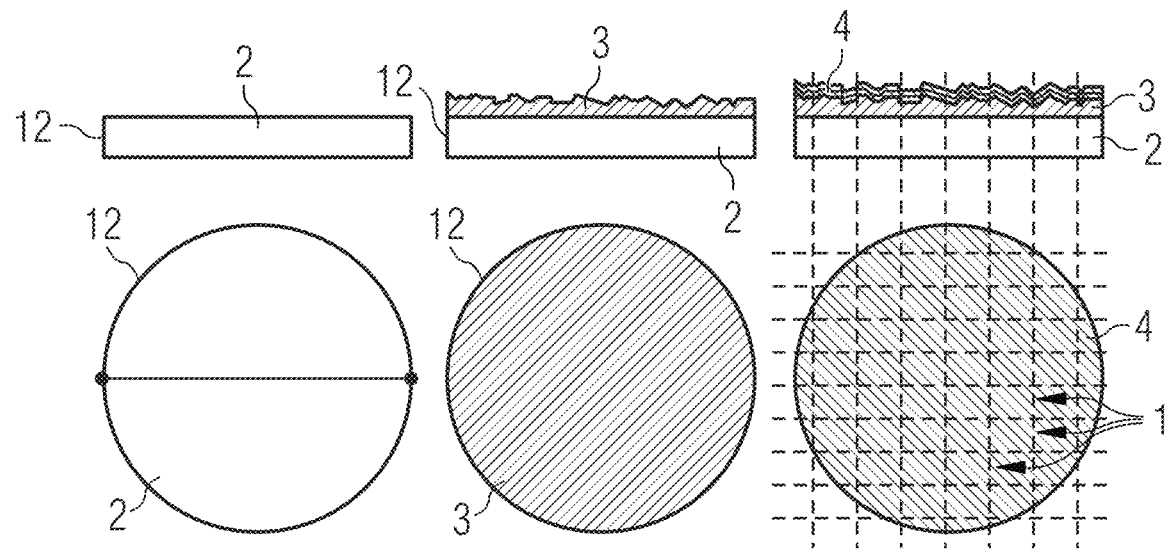
FIGS. 1 and 2 show schematic sectional representations of various method stages of a method for producing optoelectronic components, respectively according to an exemplary embodiment.

In the method for producing optoelectronic components 1 according to the exemplary embodiment of FIG. 1, in a first step a multiplicity of radiation-emitting semiconductor chips 2, which are designed to emit primary radiation of a first wavelength range during operation, are provided. The provision of the multiplicity of radiation-emitting semiconductor chips 2 is carried out in a wafer assembly 12. The wafer assembly 12 is a 6" wafer assembly fully occupied with radiation-emitting semiconductor chips 2 having a size of 1 mm$^2$.

In a next step, a converter 3, which is designed for emitting secondary radiation of a second wavelength range, is applied onto the multiplicity of radiation-emitting semiconductor chips 2. The converter 3 is applied surface-wide onto the multiplicity of radiation-emitting semiconductor chips 2. This is carried out still in the wafer assembly 12.

That surface of the converter 3 which faces away from the multiplicity of semiconductor chips 2 is configured nonuniformly. The converter 3 is sprayed onto the multiplicity of radiation-emitting semiconductor chips 2 in from one to three sprayed layers.

The converter 3 comprises a matrix and a phosphor. The phosphor is preferably present in the form of phosphor particles. The converter 3 preferably comprises red phosphor particles. The matrix is for example a silicone, a hybrid material or an epoxide, and is uncured in this step.

In a further step, a mirror layer sequence 4, which is designed to reflect the primary radiation and transmit the secondary radiation, is applied. The mirror layer sequence 4 is arranged downstream of the converter 3. The mirror layer sequence 4 is arranged surface-wide on the converter 3. The mirror layer sequence 4 is applied on the converter 3 by means of sputtering, atomic layer deposition and/or plasma-enhanced chemical vapor deposition. The mirror layer sequence 4 is in this case applied directly on the converter 3. The mirror layer sequence 4 likewise has an uneven top face.

The converter 3 is cured after the application of the mirror layer sequence 4.

Subsequently, the multiplicity of radiation-emitting semiconductor chips 2, the converter 3 and the mirror layer sequence 4 are singulated in order to produce optoelectronic components 1. In this case, sawing is preferably carried out along the edge of the semiconductor chips 2 without thereby damaging the semiconductor chips 2.

Figure 2:
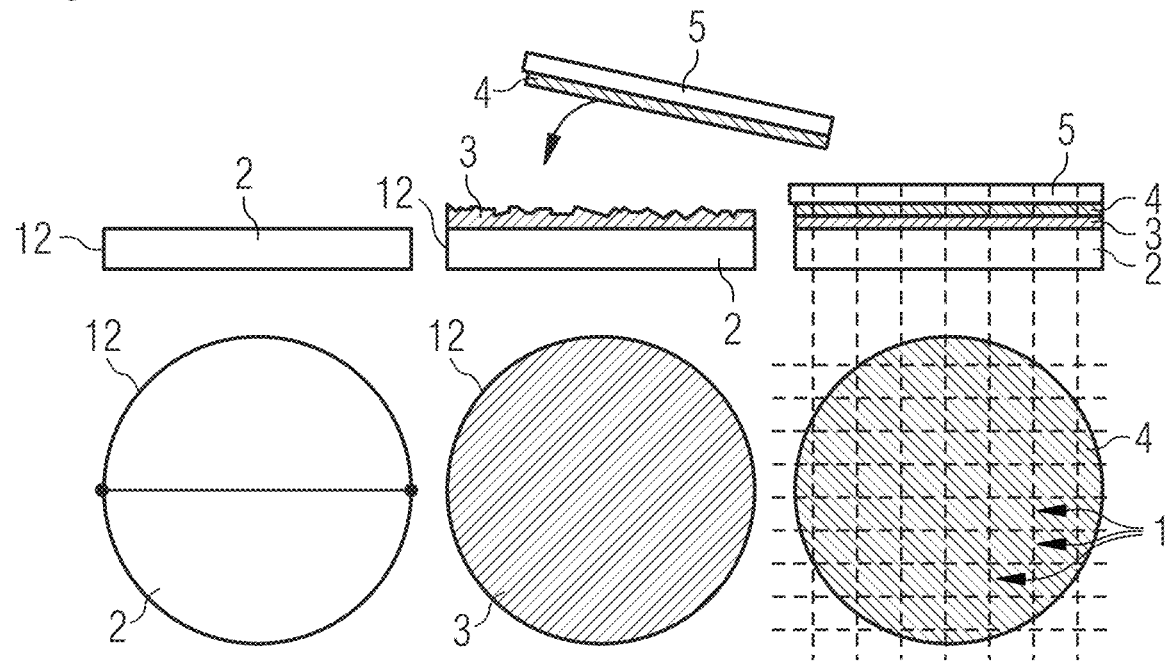

In the exemplary embodiment of FIG. 2, likewise in a first step, a multiplicity of radiation-emitting semiconductor chips 2, which are designed to emit primary radiation of a first wavelength range during operation, are provided. The multiplicity of radiation-emitting semiconductor chips 2 are applied in a wafer assembly 12. The wafer assembly 12 is fully occupied with radiation-emitting semiconductor chips 2 having a size of 1 mm$^2$.

Subsequently, a converter 3, which is designed for emitting secondary radiation of a second wavelength range, is applied onto the multiplicity of radiation-emitting semiconductor chips 2. This is likewise carried out here by means of spray coating. The converter 3 comprises a matrix and a phosphor, the phosphors preferably being introduced into the matrix as phosphor particles. The matrix is for example a silicone, a hybrid material or an epoxide, and is uncured in this step.

In a next step, the mirror layer sequence 4 is vapor-deposited onto a carrier 5 and the carrier 5 is arranged downstream of the converter 3, so that the mirror layer sequence 4 is arranged between the converter 3 and the carrier 5. The carrier 5 comprises, for example, a glass. The mirror layer sequence 4 is for example vapor-deposited onto the carrier 5 at room temperature, and the carrier 5 and the mirror layer sequence 4 are then thinned to a thickness of at most 200 micrometers. After the application of the mirror layer sequence 4 and the carrier 5 onto the converter 3, the converter 3 is cured so that a smooth surface is formed and the mirror layer sequence 4 is connected firmly to the converter 3. The smooth surface of the converter 3 is located on the side facing away from the semiconductor chip 2. Subsequently, the multiplicity of semiconductor chips 2, converter 3, mirror layer sequence 4 and carrier 5 are singulated in order to produce optoelectronic components 1.

Figure 3:
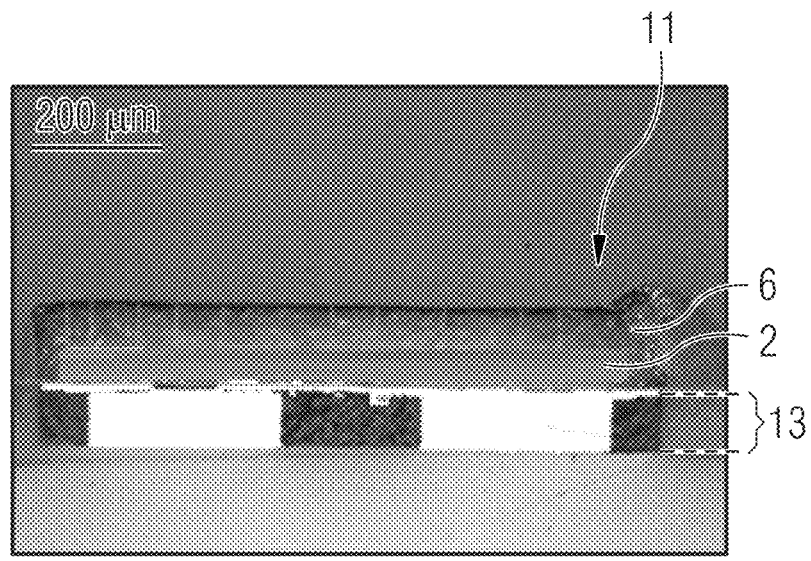
FIG. 3 shows a cross section of a light-microscopy image of a comparative example of an optoelectronic component.

In the light-microscopy image of FIG. 3 of the comparative example 11 of an optoelectronic component, a conversion element 6 applied by means of spray coating is shown on a radiation-emitting semiconductor chip 2. The comparative example 11 is arranged on a surface 13 which comprises electrical contacts. The comparative example 11 does not have a dielectric mirror 7. The spray coating is carried out in at least six sprayed layers. Furthermore, the conversion element 6 is arranged directly on the semiconductor chip 2. The conversion element 6 has a thickness of about 150 micrometers. The phosphor of the conversion element 6 is a red-emitting phosphor.

Figure 4:
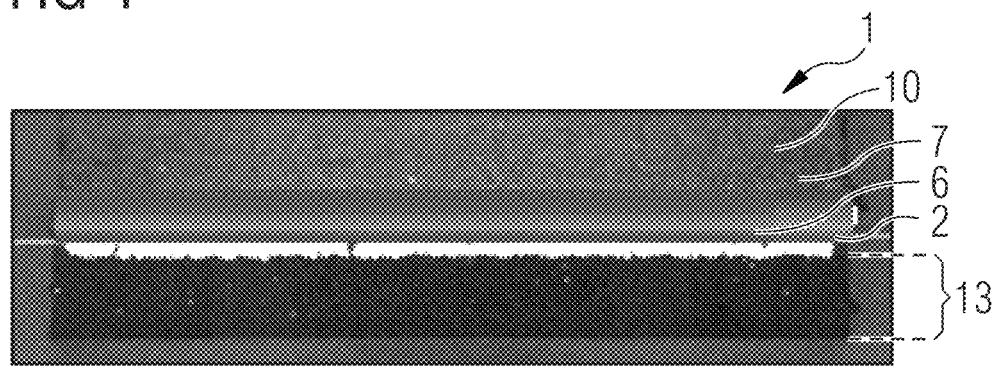
FIG. 4 shows a cross section of a light-microscopy image of an optoelectronic component according to one exemplary embodiment.

In FIG. 4, an optoelectronic component 1 is likewise represented in a cross section of a light-microscopy image according to one exemplary embodiment. The optoelectronic component 1 is arranged on a surface 13, which comprises electrical contacts. In this case, a conversion element 6 is applied on the radiation-emitting semiconductor chip 2. On the conversion element 6, there are a dielectric mirror 7 and a carrier element 10. The phosphor is in this case a phosphor in which the secondary radiation is red light. The conversion element 6 has a thickness of between at least 50 micrometers and 65 micrometers. In particular, the conversion element 6 has a thickness of approximately 56 micrometers. The dielectric mirror 7 has a thickness of at most 10 micrometers. The carrier element 10 has a thickness of at most 200 micrometers.

Figure 5:
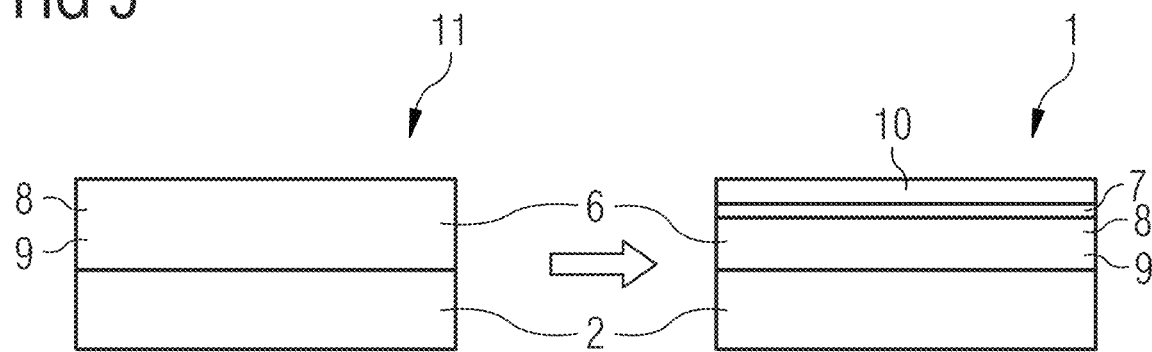
FIG. 5 shows a schematic sectional representation of a comparative example of an optoelectronic component and a schematic sectional representation of an optoelectronic component according to one exemplary embodiment.

FIG. 5 shows a comparison between two schematic sectional representations of an optoelectronic component 1, 11. The left schematic sectional representation shows a comparative example of an optoelectronic component 11, in which a dielectric mirror 7 is not arranged on the conversion element 6.

The right schematic sectional representation according to an exemplary embodiment shows a radiation-emitting semiconductor chip 2 which emits primary radiation of a first wavelength range during operation, a conversion element 6 which is designed to emit secondary radiation of a second wavelength range, and a dielectric mirror 7, the dielectric mirror 7 being designed to reflect the primary radiation and transmit the secondary radiation. On the dielectric mirror 7, there is furthermore a carrier element 10. The carrier element 10 for example comprises a glass, and may optionally also be omitted. The conversion element 6 comprises a phosphor 9, preferably phosphor particles and a matrix material 8. The difference between the two figures is the thickness of the conversion element 6. The thickness of the conversion element 6 may be configured to be particularly thin in the optoelectronic component 1 described here. The thickness of the conversion element 6 may be reduced by up to more than 60% in comparison with the comparative example 11. This leads to a cost reduction.

Figure 6:
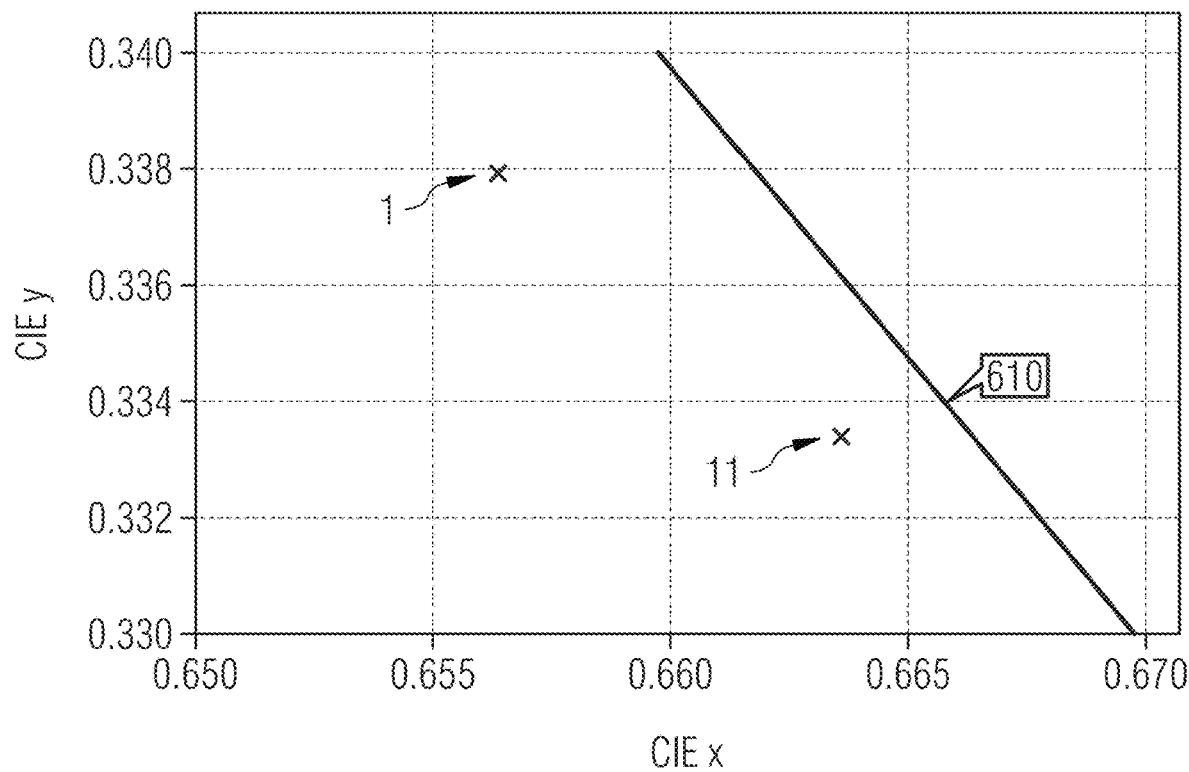
FIG. 6 shows a detail of an xy CIE standard color system.

FIG. 6 shows by way of example an xy CIE standard color system. In this case, CIE y is plotted against CIE x. When using the same phosphor in the conversion element 6 of the optoelectronic component 1, 11, the comparative example of the optoelectronic component 11 exhibits a different color locus than the optoelectronic component 1 described here. The color locus of the emitted radiation of the optoelectronic component 1 described here lies in a color rectangle having corners at the coordinates (0.655, 0.337), (0.658, 0.337), (0.655, 0.339) and (0.658, 0.339). The color locus of the comparative example 11 is shifted toward larger CIE x values and smaller CIE y values.

Figure 7:
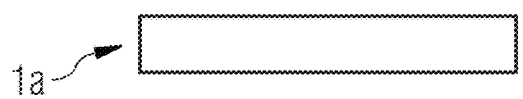
FIG. 7 shows a luminous flux comparison at 350 mA and 1A of a comparative example of an optoelectronic component and of an optoelectronic component according to one exemplary embodiment.
Figure 7:
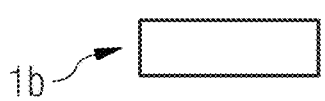
Figure 7:
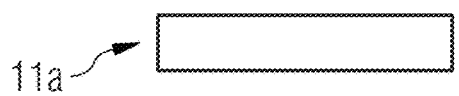
Figure 7:
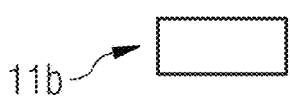

FIG. 7 represents a comparison between an optoelectronic component 1a and 1b as described here and a comparative example 11a and 11b. Here, a luminous flux comparison is shown at 350 mA and 1A. 1a and 11a are the results of the measurements at 1A, and 1b and 11b are results of the measurements at 350 mA. The optoelectronic component 1 described here has an approximately 36% higher luminous flux because of the thinner conversion element 6 and the dielectric mirror 7.

Figure 8:
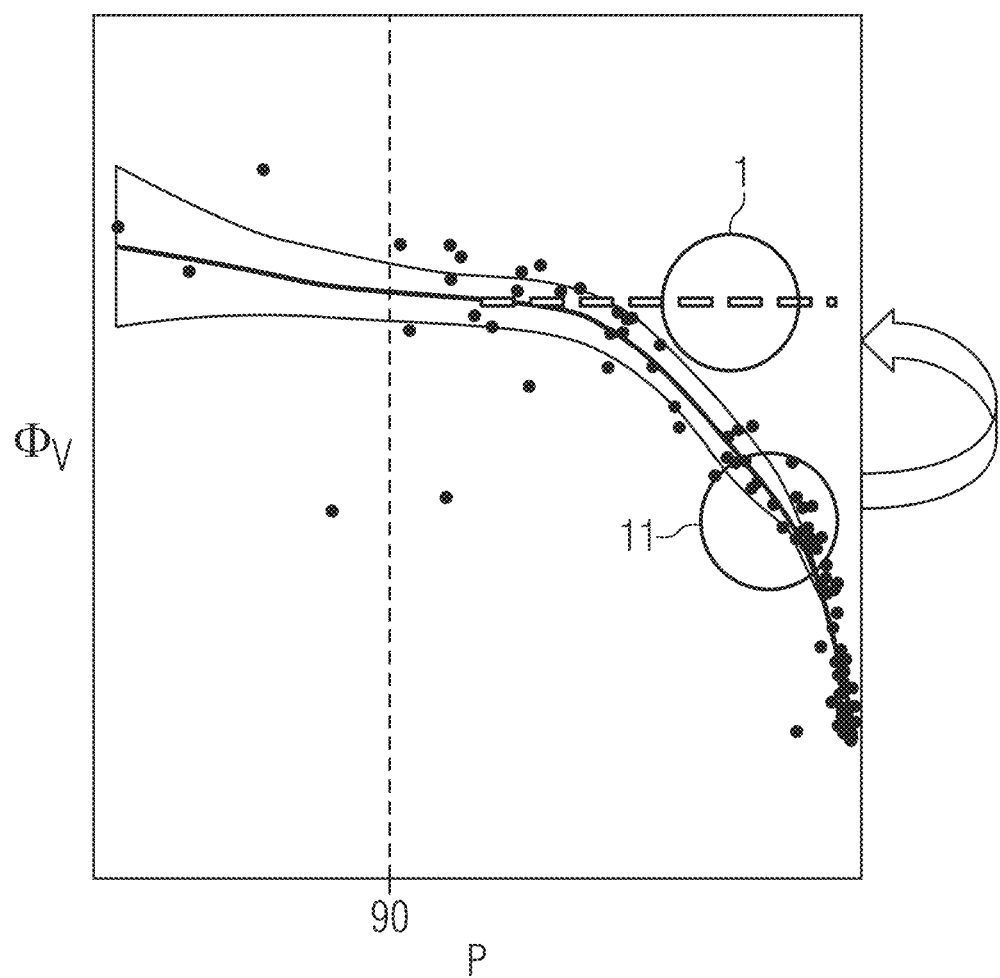
FIG. 8 shows a schematic dependency of the brightness on the color purity of a comparative example of an optoelectronic component and a schematic dependency of the brightness on the color purity of an optoelectronic component according to one exemplary embodiment.

FIG. 8 shows the brightness $\Phi_v$ as a function of the color purity p of a comparative example of an optoelectronic component 11 and an optoelectronic component 1 as described here. The comparative example of the optoelectronic component 11 has an enlarged conversion element or an increased concentration of phosphor particles or scattering particles in comparison with the optoelectronic component 1 as described here. For the comparative example of the optoelectronic component 11, this leads to not inconsiderable losses due to reabsorption. The optoelectronic component 1 described here shows scarcely any losses in the brightness $\Phi_v$ in comparison with the comparative example 11 for a color purity p of more than 90%. The color purity p is preferably greater than or equal to 92% in the case of full conversion.

The features and exemplary embodiments described in connection with the figures may be combined with one another according to further exemplary embodiments, even if not all combinations are explicitly described. Furthermore, the exemplary embodiments described in connection with the figures may alternatively or additionally comprise further features according to the description in the general part.

The invention claimed is:

1. A method comprising:
providing a plurality of radiation-emitting semiconductor chips configured to emit primary radiation of a first wavelength range;
applying a converter on the plurality of radiation-emitting semiconductor chips, the converter configured to emit secondary radiation of a second wavelength range;
applying a mirror layer sequence directly on and downstream of the converter, wherein the converter is present in an uncured state during application of the mirror layer sequence, and wherein the mirror layer sequence is configured to reflect the primary radiation and transmit the secondary radiation;
after applying the mirror layer sequence curing the converter; and
singulating the plurality of radiation-emitting semiconductor chips in order to produce optoelectronic components,
wherein the converter is applied on the plurality of radiation-emitting semiconductor chips by spray coating, and
wherein the mirror layer sequence is applied on the converter by sputtering, atomic layer deposition and/or plasma-enhanced chemical vapor deposition (PECVD).

2. The method of claim 1, wherein the plurality of radiation-emitting semiconductor chips is provided in a wafer assembly.

3. The method of claim 1, wherein the mirror layer sequence is applied on a carrier, wherein the carrier is arranged downstream of the converter so that the mirror layer sequence is arranged between the converter and the carrier.

4. The method of claim 1, wherein the secondary radiation of the converter is red light.

5. The method of claim 1, wherein the converter is configured as a layer and has a thickness of between at least 50 micrometers and at most 100 micrometers, inclusive.

6. The method of claim 1, wherein the mirror layer sequence has a thickness of at most 10 micrometers.

7. The method of claim 1, wherein the mirror layer sequence comprises a plurality of layers with respectively different refractive indices.

8. An optoelectronic component comprising:
a radiation-emitting semiconductor chip configured to emit primary radiation of a first wavelength range;
a conversion element configured to emit secondary radiation of a second wavelength range; and
a dielectric mirror,
wherein the dielectric mirror is configured to reflect the primary radiation and transmit the secondary radiation,
wherein the dielectric mirror is arranged downstream of the semiconductor chip, wherein side faces of the dielectric mirror and of the conversion element comprise tracks of a singulation process,
wherein a color locus of an emitted radiation of the optoelectronic component lies in a range of red light with a color purity greater than or equal to 80%, and
wherein the color locus of the emitted radiation of the optoelectronic component lies in a color rectangle having corners at coordinates (0.655, 0.337), (0.658, 0.337), (0.655, 0.339) and (0.658, 0.339) in a xy Commission Internationale de l'Eclairage (CIE) standard color system.

9. The optoelectronic component of claim 8, wherein the conversion element comprises a matrix material and a phosphor.

10. The optoelectronic component of claim 8, wherein the secondary radiation of the conversion element is red light.

11. The optoelectronic component of claim 8, wherein the optoelectronic component is configured to emit predominantly the secondary radiation.

12. The optoelectronic component of claim 8, wherein the conversion element is arranged downstream of the semiconductor chip and between the semiconductor chip and the dielectric mirror.

13. The optoelectronic component of claim 8, wherein the conversion element is a layer and has a thickness of between at least 50 micrometers and at most 100 micrometers, inclusive.

14. The optoelectronic component of claim 8, wherein the dielectric mirror has a thickness of at most 10 micrometers.

15. The optoelectronic component of claim 8, wherein the dielectric mirror comprises a plurality of layers with respectively different refractive indices.

16. The optoelectronic component of claim 8, further comprising a carrier element arranged on the dielectric mirror.

* * * * *